United States Patent
Hurkx

(10) Patent No.: US 9,142,763 B2
(45) Date of Patent: Sep. 22, 2015

(54) ELECTRONIC COMPONENT, AND A METHOD OF MANUFACTURING AN ELECTRONIC COMPONENT

(75) Inventor: Godefridus Adrianus Maria Hurkx, Best (NL)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 835 days.

(21) Appl. No.: 12/663,746

(22) PCT Filed: Jun. 18, 2008

(86) PCT No.: PCT/IB2008/052391
§ 371 (c)(1), (2), (4) Date: Dec. 9, 2009

(87) PCT Pub. No.: WO2008/155724
PCT Pub. Date: Dec. 24, 2008

(65) Prior Publication Data
US 2010/0155685 A1 Jun. 24, 2010

(30) Foreign Application Priority Data
Jun. 20, 2007 (EP) .................... 07110692

(51) Int. Cl.
*H01L 47/00* (2006.01)
*H01L 45/00* (2006.01)

(52) U.S. Cl.
CPC ............ *H01L 45/06* (2013.01); *H01L 45/1226* (2013.01); *H01L 45/143* (2013.01); *H01L 45/144* (2013.01)

(58) Field of Classification Search
CPC .................................. H01L 45/1226
USPC ................... 257/2–5; 365/148, 163
See application file for complete search history.

(56) References Cited

U.S. PATENT DOCUMENTS

| 4,494,135 A | 1/1985 | Moussie |
| 6,252,244 B1 | 6/2001 | Reinberg |

(Continued)

FOREIGN PATENT DOCUMENTS

| DE | 30 46 701 | 10/1981 |
| DE | 30 46 721 | 10/1981 |

(Continued)

OTHER PUBLICATIONS

International Search Report and Written Opinion dated Oct. 20, 2008.

(Continued)

*Primary Examiner* — Mark Tornow
(74) *Attorney, Agent, or Firm* — McClure, Qualey & Rodack, LLP

(57) ABSTRACT

An electronic component (100), a first electrode (101), a second electrode (102), and a convertible structure (103) electrically coupled between the first electrode (101) and the second electrode (102), being convertible between at least two states by heating and having different electrical properties in different ones of the at least two states, wherein the convertible structure (103) comprises terminal portions (104, 105) connected to the first electrode (101) and to the second electrode (102), respectively, and comprises a line portion (106) between the terminal portions (104, 105), the line portion (106) having a smaller width or thickness than the terminal portions (104, 105), and wherein the convertible structure (103) is arranged with respect to the first electrode (101) and the second electrode (102) so that, in one of the at least two states, the line portion (106) has an amorphous 'Spot (107) extending along only a part of the line portion (106).

21 Claims, 4 Drawing Sheets

(56) References Cited

U.S. PATENT DOCUMENTS

| | | |
|---|---|---|
| 7,026,639 B2 * | 4/2006 | Cho et al. ............................ 257/3 |
| 7,679,950 B2 * | 3/2010 | Philipp et al. .................. 365/163 |
| 7,897,952 B2 * | 3/2011 | Wouters et al. ................... 257/2 |
| 7,910,905 B2 * | 3/2011 | Liu .................................... 257/2 |
| 8,008,644 B2 * | 8/2011 | Goux et al. ........................ 257/3 |
| 2003/0179011 A1 | 9/2003 | Goodbread et al. |
| 2004/0113192 A1 | 6/2004 | Wicker |
| 2004/0164290 A1 | 8/2004 | Yi et al. |
| 2005/0167645 A1 | 8/2005 | Kim et al. |
| 2007/0096248 A1 | 5/2007 | Philipp et al. |

FOREIGN PATENT DOCUMENTS

| | | |
|---|---|---|
| DE | 103 49 750 | 5/2005 |
| EP | 1780814 A | 5/2007 |
| GB | 2 065 972 | 7/1981 |
| GB | 2 066 566 | 7/1981 |
| JP | 2007513494 | 5/2007 |
| KR | 2007-0046003 | 5/2007 |
| WO | WO 2004/057618 | 7/2004 |
| WO | WO 2005/041196 | 5/2005 |
| WO | WO2006/123305 A | 11/2006 |
| WO | WO2006/123306 A | 11/2006 |
| WO | WO2007/110815 A | 10/2007 |
| WO | WO2008/027135 A | 3/2008 |
| WO | WO 2008/146243 | 12/2008 |

OTHER PUBLICATIONS

Merget, F., et al., "Lateral Phase Change Random Access Memory Cell Design for Low Power Operation," Microsystem Technologies; Micro and Nanosystems Information Storage and Processing Systems, Springer, Berlin, De., vol. 13, No. 2, Apr. 5, 2006, pp. 169-172.
Korean language office action dated Mar. 10, 2011.
English language translation of Korean office action.
English language translation of abstract of KR 2007-0046003 (published May, 2, 2007).
German language office action dated Jun. 27, 2011.
English language translation of German language office action.
English language translation of abstract of WO 2005/041196 (published May 6, 2005).
Chinese language office action dated Aug. 12, 2010.
English language translation of abstract of JP 2007513494 (Published May 24, 2007).
Japanese language office action dated Jun. 12, 2012.

* cited by examiner

ELECTRONIC COMPONENT, AND A METHOD OF MANUFACTURING AN ELECTRONIC COMPONENT

CROSS REFERENCE TO RELATED APPLICATION

Priority

This application is a United States national phase application of co-pending international patent application number PCT/IB2008/052391, filed Jun. 18, 2008, which claims priority to European international patent application No. 07110692.6, filed Jun. 20, 2007, the disclosures of which are incorporated herein by reference

FIELD OF THE INVENTION

The invention relates to an electronic component.
Moreover, the invention relates to a method of manufacturing an electronic component.

BACKGROUND OF THE INVENTION

In the field of non-volatile memories, flash memory scaling beyond a 45 nm node has become a real issue. Technologies to face this challenge are ferroelectric, magnetic and phase change memories, the latter one being promising for the replacement of flash and showing characteristic that may allow replacement of other types of memories such as DRAM. Phase change memories are a possible solution for the unified memory being an important step in the electronics art. OTP ("on time programmable") and MTP ("multiple times programmable") memories open a field that may present a great opportunity for phase change memories as well.

Phase change memories are based on a reversible memory switching using, for instance, chalcogenide materials. The ability of these materials to undergo fast phase transition has led to the development of rewritable optical media (CD, DVD). The chalcogenide phase change materials may be divided in two classes which are slightly different compositions, based on their crystallization mechanism. The "nucleation dominated" material GeTe—$Sb_2Te_3$ tie line such as $Ge_2Sb_2Te_5$ are generally used in ovonic unified memory (OUM) devices. In this concept, the phase change material may be in contact with a bottom-resistive electrode to switch reversibly to a small volume of phase change material. "Fast growth material", known in optical storage application (CD-RW/DVD+RW), enable very fast switching (for instance 10 ns) with a proper phase stability. In such an approach, the active part of a memory device may be a phase change line formed in between two electrodes formed in the back end of line processing (BEOL) of a CMOS-based front end of line (FEOL).

Thus, phase change materials may be used to store information. The operational principle of these materials is a change of phase. In a crystalline phase, the material structure is, and thus properties are, different from the properties in the amorphous phase.

The programming of a phase change material is based on the difference between the resistivity of the material in its amorphous and crystalline phase. To switch between both phases, an increase of the temperature is required. Very high temperatures with rapid cooling down will result in an amorphous phase, whereas a smaller increase in temperature or slower cooling down leads to a crystalline phase. Sensing the different resistances may be done with a small current that does not cause substantial heating.

The increase in temperature may be obtained by applying a pulse to the memory cell. A high current density caused by the pulse may lead to a local temperature increase. Depending on the duration and amplitude of the pulse, the resulting phase will be different. Larger pulse amplitudes, so-called RESET pulses, may amorphize the cells, whereas smaller pulse amplitudes will SET the cell to its crystalline state, these pulses are also called SET pulses.

WO 2006/079952 A1 discloses a phase change resistor device, which has a phase change material (PCM) for which the phase transition occurs inside the PCM and not at the interface with a contact electrode. The PCM is an elongate line structure surrounded by the conductive electrode portions at its lateral sides, and is formed in a CMOS backend process. There is a line of PCM, which has a constant diameter or cross section, formed with reduced dimensions by using a spacer as a hard mask. A "one dimensional" layer of the PCM electrically connects the first contact electrode and the second contact electrode. The contact resistance between the one-dimensional layer of PCM and the first contact electrode at the second contact electrode is lower than the resistance of a central or intervening portion of the line.

However, programming conventional memory cells may require high power consumption.

OBJECT AND SUMMARY OF THE INVENTION

It is an object of the invention to provide an electronic component having a convertible structure that can be programmed with reasonable power consumption.

In order to achieve the object defined above, an electronic component and a method of manufacturing an electronic component according to the independent claims are provided.

According to an exemplary embodiment of the invention, an electronic component (such as a memory cell) is provided comprising a first electrode (such as a first metallic structure) and a second electrode (such as a second metallic structure), and a convertible structure (such as a phase change material, particularly in a planar configuration) electrically coupled between the first electrode and the second electrode (for instance directly connected thereto), being convertible between at least two states by heating and having different electrical properties in different ones of the at least two states, wherein the convertible structure comprises (particularly two) terminal portions connected to the first electrode and to the second electrode, respectively, and comprises a line portion (such as a central portion) between the terminal portions, the line portion having a smaller thickness than the terminal portions, and wherein the convertible structure is arranged with respect to the first electrode and the second electrode so that, in one of the at least two states, the line portion has an amorphous spot (that is a portion of the convertible structure in an amorphous state) extending along only a part (that is not extending along the entire extension) of the line portion.

According to another exemplary embodiment of the invention, a method of manufacturing an electronic component is provided, the method comprising electrically coupling a convertible structure between a first electrode and a second electrode, the convertible structure being convertible between at least two states by heating and having different electrical properties in different ones of the at least two states, forming the convertible structure to comprise terminal portions connected to the first electrode and to the second electrode, respectively, and to comprise a line portion between the terminal portions, the line portion having a smaller thickness than the terminal portions, and arranging the convertible structure with respect to the first electrode and the second electrode so that, in one of the at least two states, the line portion has an amorphous spot extending along only a part of the line portion.

The term "electronic component" may particularly denote any component, member or apparatus that fulfils any electric, magnetic and/or electronic functionality. This means that electric, magnetic and/or electromagnetic signals may be applied to and/or generated by the electronic component during regular use.

The term "convertible structure" may particularly denote any physical structure having convertible properties. Examples are a phase change structure or a structure with thermo-dependent properties. Phase change materials can have not only two phases but also more than two phases, for instance crystalline, amorphous, meta-amorphous, meta-crystalline, crystalline with a different lattice orientation, etc.

The term "phase change structure" may particularly denote any physical structure which has the property to change any physical parameter or material property under the influence of heat (generated by ohmic losses of an electric current flowing through the phase change structure or an electrically/a thermally coupled heating element, and/or generated by the absorption of electromagnetic radiation). This may particularly mean a switch of a material such as a chalcogenide between an amorphous configuration and a crystalline configuration, which may be accompanied by a significant change in the electrical resistivity. However, any other phase changes such as a change from a solid to a liquid phase, which phase changes are connected with a change of a physical property, may be covered by this term.

The term "memory cell" may particularly denote a physical structure (such as a layer sequence, for instance monolithically integrated on/in a substrate such as a silicon substrate) which allows to store information in an electronic manner. An amount of information stored in a memory cell may be 1 bit (particularly when the phase change material is switched between two phases representing logical values "1" or "0") or may be more than 1 bit (particularly when the phase change material is switched between at least three phases). The memory cell may be formed on and/or in a substrate, which may denote any suitable material, such as a semiconductor, glass, plastic, etc.

The term "substrate" may be used to define generally the elements for layers that underlie and/or overlie a layer or portions of interest. Also, the substrate may be any other base on which a layer is formed, for example a semiconductor wafer such as a silicon wafer or silicon chip.

The term "terminal portions" of the convertible structure may particularly denote end portions of the convertible structure which are contacted or coupled, that are to say are in direct physical connection, with the metallic material of the respective electrodes.

The term "line portion" of the convertible structure may particularly denote a central portion of the convertible structure sandwiched between the two terminal portions and being partially free of a direct physical contact with the electrode material. Such a line portion may be an oblong rectangular structure being aligned along an essentially linear path.

The term "thickness" of the line portion and of the terminal portions of the convertible structure may denote a thickness in a direction within a surface plane of an electronic component, which direction is perpendicular to a current flow direction.

The terms "broad" and "narrow" of electrodes may denote a thickness in a direction within a surface plane of an electronic component, which direction is perpendicular to a current flow direction. Thus, the current flow may occur along a connection direction of the broad portion and the narrow portion of the electrodes.

The term "amorphous spot" may particularly denote a sub-portion (or a geometrical subset) of the line portion in an operation state of the convertible structure in which it is brought into an amorphous state by previously applying a so-called RESET pulse. Without wishing to be bound to a specific theory, it is presently believed that the application of such a RESET pulse to the line portion results, due to thermoelectric effects such as the Thomson effect, in an asymmetric temperature distribution along the line cell so that only a portion of the line cell will exceed a threshold temperature for switching to the amorphous state, thereby amorphizing only a sub-portion of the line portion by such a RESET pulse.

The term "asymmetric" characterizing an arrangement of the convertible structure relative to the first electrode and the second electrode may particularly denote that any asymmetric property is included in the design/arrangement of these components such as an asymmetric shift of these components relative to one another or asymmetric (such as mirror-asymmetric) geometrical properties of corresponding portions of these structures.

The term "mirror symmetry" characterizing a convertible structure may particularly denote reflection symmetry of the geometrical shape of the convertible structure. In 2D there is an axis of symmetry, in 3D a plane of symmetry. An object or figure, which is indistinguishable from its transformed image, may be called mirror symmetric. The axis of symmetry of a two-dimensional figure is a line such that, if a perpendicular is constructed, any two points lying on the perpendicular at equal distances from the axis of symmetry are identical. Another way to think about it is that if the shape were to be folded in half over the axis, the two halves would be identical: the two halves are each other's mirror image. A non-mirror-symmetric structure does not have the property of mirror symmetry. More particularly, there may be two lines (2D) or planes (3D) of symmetry. One is a line (plane) in the direction of the current (symmetry between "top half" and "bottom half" of line) and the other is a line (plane) perpendicular to the current direction (symmetry between "left half" and "right half" of line). Here, particularly the latter symmetry is meant.

According to an exemplary embodiment of the invention, the geometrical arrangement and the design of electrodes and a convertible structure may be configured such that only a part of a line portion of the convertible structure, that is to say not the entire line portion, is brought into an amorphous phase upon applying a RESET pulse. By taking such a measure, that is to say by making the amorphous spot small, the threshold voltage for programming may be kept small, resulting in moderate power demands for programming. It may be particularly advantageous to overlap at least a portion of the line portion of the convertible structure with electrode material, so that only a remaining sub-portion of the line portion bridges the two electrodes without a direct physical connection to the electrode material.

Thus, an electronic component may be provided that is particularly suited to be implemented in present and future CMOS generations because of reduced power consumption, reduced threshold voltage (should be below the maximum supply voltage) and reduced lateral dimensions. Accordingly, disadvantages of conventional lateral memory cells may be overcome so that downscaling to small lateral dimensions and low programming power and low threshold voltage may be made possible.

Thus, according to an exemplary embodiment of the invention, a memory cell is provided comprising a phase change material structure of a first length, the phase change material structure further comprising a first terminal and a second terminal and an amorphous spot having a second length that is smaller than the first length. The second length of the amorphous spot may be defined by a distance between metal electrodes placed on or under the phase change material structure. The metal electrodes may be arranged symmetrically or asymmetrically with respect to the phase change material structure. In a further embodiment, the metal electrodes may be shaped to have a similar shape as the shape of the phase change material to be covered by the respective metal electrode.

By taking such a measure, a low threshold voltage may be obtained. An additional advantage is that for the anode region (that is to say for the electrode being coupled to the positive/plus pole of a programming current/voltage source), the edge of the amorphous spot may be fixed by the transition from the narrow phase change line to the wide part of the line so that the heat loss to the metal part of the anode is reduced. By taking this measure, high performance phase change memory cells with moderate threshold voltages and properties regarding heat losses to the metal part may be constructed.

Particularly, an asymmetric cell layout for phase change materials may be provided. Thus, a phase change material with an asymmetric lateral metal electrode configuration or a symmetric lateral metal electrode configuration may be provided shaped to define an amorphous spot in a narrow manner and/or to avoid heat leakage. This may allow manufacturing phase change cell memories, particularly in CMOS, more particularly in C065 technology. There is experimental evidence that due to thermoelectric effects, an asymmetric shifting of an amorphous spot within the narrow convertible material may be present. By corresponding geometrical designs (for instance by an asymmetrical configuration) such effects may be taken into account, may be suppressed or may be even eliminated to improve the programming properties of the cell.

Particularly, a dogbone structure (see, for instance FIG. 4 or FIG. 12) of a convertible material may be advantageous. Such a configuration may be advantageous, since such a configuration may have desired properties regarding a contact resistance between phase change material and an electrode. When the shape of the phase change material layer is a dogbone, this may keep the total resistance small. The total area covered by the metal may be important regarding the contact resistance.

According to an exemplary embodiment of the invention, an amorphous spot may be achieved being smaller than a distance available due to processing technology. The extension of the effective amorphous spot may then be defined by the metal electrodes only or by at least one metal electrode and the opposite phase change material terminal structure. Reduction of heat leakage towards the electrodes by a corresponding electrode design may be a separate feature applicable to embodiments of the invention. One additional aspect is that the spot may be shifted towards the anode, so that an asymmetry of the spot may be suppressed efficiently. A symmetric/asymmetric position as well as an extension of the amorphous spot can be made visible experimentally, for instance by taking TEM photographs of the phase change layer.

Next, further exemplary embodiments of the electronic component will be explained. However, these embodiments also apply to the method of manufacturing an electronic component.

The convertible structure may form a thermo-dependent structure, particularly a phase change structure which is convertible between at least two phase states. Thus, under the influence of heat which may be generated by ohmic losses of a programming current flowing through the phase change structure and/or electrodes connected thereto, the switch between the two phases can be initiated. Thermal energy may also be supplied via electromagnetic radiation. However, thermal energy can be also supplied by a contiguous structure/heater.

Particularly, the phase change structure may be adapted such that a value of the electrical conductivity differs between the two phase states. In one of the at least two phase states, the phase change structure may be electrically conductive (for instance essentially metallically conductive). In the other phase state, the electrical conductivity may be larger or lower than in the first state, for instance the phase change structure may be superconductive or may be semiconductive or may be isolating or may be conductive as well with a modified value of conductivity. In a normal operation of the electronic component, the function of the electronic component will be influenced, will be defined or will depend on the present value of the electrical conductivity of the phase change structure. This may allow to manufacture memory cells, switches, actuators, sensors, etc. using the different value of the electrical conductivity of the phase change structure in the different phase modes.

By a current pulse or a current signal, heat may be generated in a convertible material to thereby change its phase state and consequently its value of the electrical conductivity. The applied current pulses may have a certain shape (for instance may have a fast raising edge and a slow falling edge, or may have a raising edge which is curved to the right and a falling edge which is curved to the left) and may be characterized by different parameters (such as current amplitude, pulse duration, etc.). By adjusting the pulse parameters, it is possible to control whether the phase change material is converted into a crystalline phase or is converted into an amorphous phase. Very high temperatures with rapid cooling down may result in an amorphous phase. A smaller increase in temperature or slower cooling down may lead to a crystalline phase.

The phase change structure may be adapted such that one of the two phase states relates to a crystalline phase and the other one of the two phase states relates to an amorphous phase of the phase change structure. Such a material property can be found in chalcogenide materials. A chalcogenide glass may be used which is a glass containing a chalcogenide element (sulphur, selenium or tellurium) as a substantial constituent. Examples for phase change materials are GeSbTe, AgInSbTe, InSe, SbSe, SbTe, InSbSe, InSbTe, GeSbSe, GeSbTeSe or AgInSbSeTe.

The electronic component may comprise an electric sensing circuitry adapted for sensing the different electrical properties of the convertible structure in different ones of the at least two states. For instance, a test voltage may be applied to the convertible structure, and a current flowing along the convertible structure will depend on the phase state of the convertible structure, since the electrical conductivity is different in the crystalline and in the amorphous phase. Such a sensing circuitry may also include selection transistors or other kinds of switches which selectively enable or disable access to a particular electronic component of an array of electronic components. Thus, a respective selection transistor may be assigned to each one of the electronic components.

According to an exemplary embodiment of the invention, the convertible structure may be arranged symmetrically with respect to the first electrode and the second electrode. Such a configuration may be easy to manufacture. For instance, the embodiments of FIG. 4, FIG. 6, FIG. 7, and FIG. 15 show such a symmetric configuration According to such an embodiment, the first electrode and the second electrode may be identical regarding at least one of the group consisting of a shape (for example a contour), an area, and a material (such as tungsten or TaN). By making shape, area and/or material identical for the two electrodes, an easy process integration and a simple layout may be obtained.

According to another exemplary embodiment, the convertible structure may be arranged asymmetrically with respect to the first electrode and the second electrode. For such a configuration, an asymmetric arrangement of an amorphous spot may be compensated by an inverse asymmetric configuration of phase change material and electrodes, thereby efficiently reducing heat losses when programming. For instance, the embodiments of FIG. 2, FIG. 3, FIG. 5, FIG. 8, FIG. 9, and FIG. 14 show such a symmetric configuration.

Particularly, the first electrode and the second electrode may differ regarding at least one of the group consisting of a shape, an area, and a material. Such differences may result in an asymmetric configuration.

The convertible structure may be a mirror symmetrical structure. Such an embodiment may be combined with a symmetrical or with an asymmetrical configuration of the electrodes. A mirror symmetrical structure may be a structure which has a left-hand portion and a right-hand portion, wherein the left-hand portion can essentially be mapped on the right-hand portion by reflection. Alternatively, the convertible structure may be a non-mirror symmetrical structure. Such an embodiment may be combined with a symmetrical or an asymmetrical configuration of the electrodes. A non-mirror symmetrical structure may lack symmetry.

A section of the line portion may be provided to overlap (in a contacting manner) with the first electrode and/or with the second electrode. With such an overlapping section, the size of the amorphous spot may be reduced, since it is presently believed that this overlapping portion is not converted into the amorphous state by applying a RESET pulse.

At least one of the group consisting of the first electrode and the second electrode may comprise a broad portion and a narrow portion being narrower than the broad portion, wherein the narrow portion overlaps with a section of the line portion. The direction along which the narrow portion is narrower than the broad portion may particularly be the same direction along which the line portion of the convertible structure has a smaller thickness than the terminal portions of the convertible structure. By providing a narrow tip or nose of the electrodes, the heat leakage towards the electrodes may be significantly reduced. The first electrode and/or the second electrode may be shaped in a rectangular manner, or in a rectangular manner having a narrow end portion, or with an L-shape.

The convertible structure may be shaped similar as a dog-bone, a bar-bell, or the letter "U".

The electronic component may be adapted as a memory device. In such a memory device, the information of one or more bits may be stored in the present phase of the phase change material, particularly depending on the present one of two or more phase states of the phase change structure.

The electronic component may also be adapted as a memory array, that is a configuration of a (large) plurality of memory devices of the aforementioned type. In such a memory array, the memory cells may be arranged in a matrix-like manner and may be controlled via bit lines and word lines with transistors serving as switches to get or prevent access to desired individual memory cells and memory devices. The multiple memory cells may be monolithically integrated in a common (for instance silicon) substrate.

The electronic component may also serve as an actuator, since a change of the electrical conductivity of the phase change structure may result in a modification of an actuation signal.

It is also possible to adapt the electronic component as a microelectromechanical structure (MEMS). An electrical signal modified by a phase change of the convertible material may result in a specific motion of a movable component of the microelectromechanical structure (MEMS).

It is clear that the modification of the phase change material, and therefore of its electrical conductivity, may be used to construct controllers, switches, transductors, etc.

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

Any process technologies like CMOS, BIPOLAR, BIC-MOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
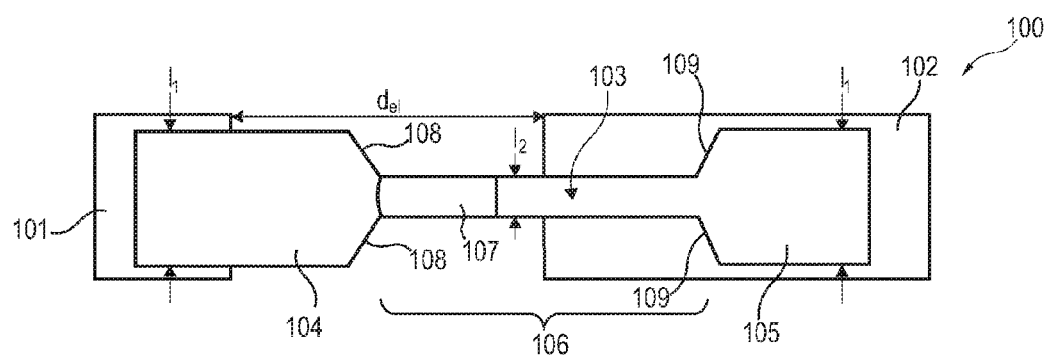
FIG. 1 to FIG. 9 show electronic components according to exemplary embodiments of the invention.

The illustration in the drawing is schematical. In different drawings, similar or identical elements are provided with the same reference signs.

In the following, referring to FIG. 1, an electronic component 100 according to an exemplary embodiment of the invention will be explained.

The electronic component comprises a first electrode 101 having a rectangular shape. The electronic component 100 further comprises a second electrode 102 also having a rectangular shape and having a larger area than the first electrode 101. Although not shown in FIG. 1, the electrodes 101 and 102 are metal electrodes deposited on a surface of a substrate such as silicon substrate or an insulator substrate. Further electronic components may be monolithically integrated in such a substrate to contact the electrodes 101, 102. The configuration of FIG. 1 is planar, that is to say the electrodes 101, 102 are essentially at the same level above the substrate. FIG. 1 shows a plan view of the electronic component 100.

A phase change material structure 103 having a bar-bell geometry is provided and is electrically coupled between the electrodes 101, 102. The convertible structure 103, more precisely a part thereof, is convertible between an amorphous state and a crystalline state by heating by means of a SET/RESET current to be applied between the electrodes 101, 102. The phase change material structure 103 has different values of the electrical conductivity in the amorphous and the crystalline state.

The phase change structure 103 comprises a first terminal portion 104 and a second terminal portion 105. The first terminal portion 104 overlaps partially with the first electrode 101 to be electrically coupled to the first electrode. The second end terminal portion 105 is arranged completely on the second electrode 102. Beyond this, an oblong line portion 106 extending along a horizontal direction of FIG. 1 is provided to bridge the first terminal portion 104 and the second terminal portion 105 having a tapering transition/intermediate portion 108, 109. The line portion 106 has a thickness (or width) $l_2$ being smaller than a thickness (or width) $l_1$ of the end portions 104, 105.

The convertible structure 103 is arranged with respect to the electrodes 101, 102 so that in the amorphous state of the phase change material 103, the line portion 106 has an amorphous spot 107 extending along a sub-portion of the line portion 106. The remaining part of the line portion 106 may still be maintained in a crystalline state upon application of a RESET pulse. In other words, also in an amorphous state of the amorphous spot 107, the remaining portion of the line portion 106 which is not indicated as the amorphous spot 107 remains essentially crystalline. In contrast to this, in the crystalline state of the phase change material 103, essentially the entire extension of the line portion 106 is crystalline.

The convertible structure 103 is arranged asymmetrically with respect to the electrodes 101, 102. Particularly, the two electrodes 101, 102 differ regarding shape and surface area. The convertible structure 103 is provided as a non-mirror symmetrical structure, since the end portion 104 has another area than the end portion 105.

As can be taken from FIG. 1, a right-hand side end section of the line portion 106 overlaps with the second electrode 102, thereby reducing the threshold voltage.

FIG. 1 shows an asymmetric line cell layout for a phase change memory. The electrodes 101, 102 are metal electrodes which can be manufactured, for instance, from TaN or from tungsten. FIG. 1 shows a configuration of a line cell layout for a phase change material. The basic operation of the memory is that after ohmic heating of a phase change material 103 above the melting point and subsequent quenching, the material is in an amorphous high ohmic state, particularly in a portion 107. The material can be converted back in the low ohmic crystalline state by heating up above the recrystallization temperature. The amorphous spot 107, in which the phase change material 103 is high ohmic in the amorphous state, is indicated in FIG. 1.

The threshold voltage should be sufficiently low (for instance below the maximum supply voltage in a CMOS technology). In FIG. 1, the reduction of the length of the amorphous spot 107 (that is to say the reduction of the threshold voltage) is not limited by the distance allowed by the technology. By the partial overlap of the line portion 106 with the second electrode 102, the programming characteristic of the electronic component 100 is improved. In addition to the above considerations, the amorphous spot 107 is not in the middle of the line 106, but shifted towards the anode (first electrode 101 in the embodiment of FIG. 1, when a positive polarity is assigned to the first electrode 101) due to electro-thermal effects such as the Thomson effect.

Thus, FIG. 1 shows an asymmetric layout which yields for the electrode distance $d_{el}$ and the phase change line length (see bracket assigned to reference numeral 106) a small amorphous region 107, hence a low threshold voltage. An additional advantage is that for the anode region 101, the edge of the amorphous spot 107 is fixed by the transition from the narrow phase change line 106 to the wide part 104 of the line cell, so that the heat loss to the metal part of the anode 101 is reduced.

The tapered intermediate portions 108, 109 in FIG. 1 can also have other geometrical shapes, for instance the transition can also be abrupt. For the cathode region 102, the metal electrode 102 fixes the edge of the amorphous region 107, but here the heat loss may be small due to electro-thermal effects. Thus, a small threshold voltage and a small RESET current may be obtained with the configuration of FIG. 1.

Figure 2:
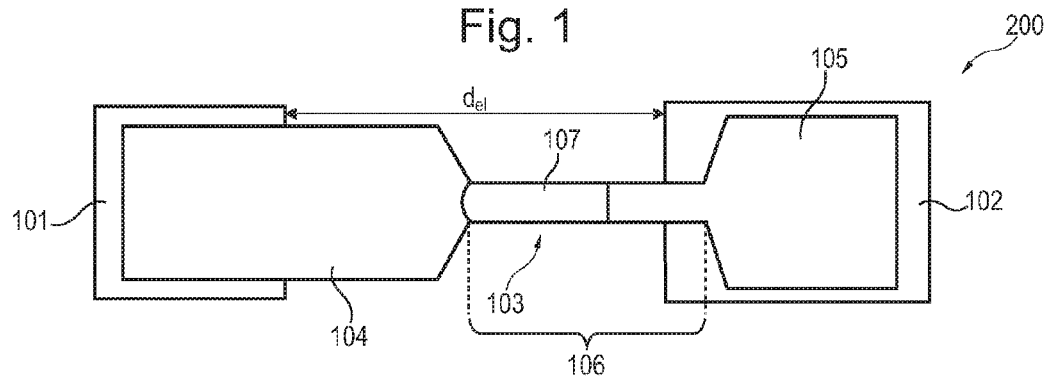

FIG. 2 shows an electronic component 200 according to another exemplary embodiment of the invention. FIG. 2 shows a configuration in which the phase change line 106 is dimensioned shorter than in FIG. 1.

Figure 3:
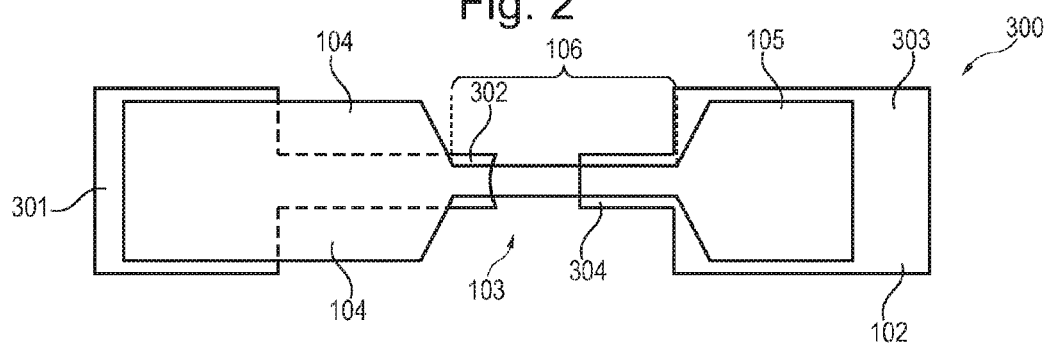

FIG. 3 shows an electronic component 300 in which each of the electrodes 101, 102 comprises a corresponding extension 302, 304 further limiting the length of the amorphous spot 107 and preventing an excessive heat leakage to the electrodes 101, 102. The noses or protrusions 302, 304 overlap with the narrow portion 106 of the phase change line 103, thereby resulting in a reduction of the heat leakage.

Figure 4:
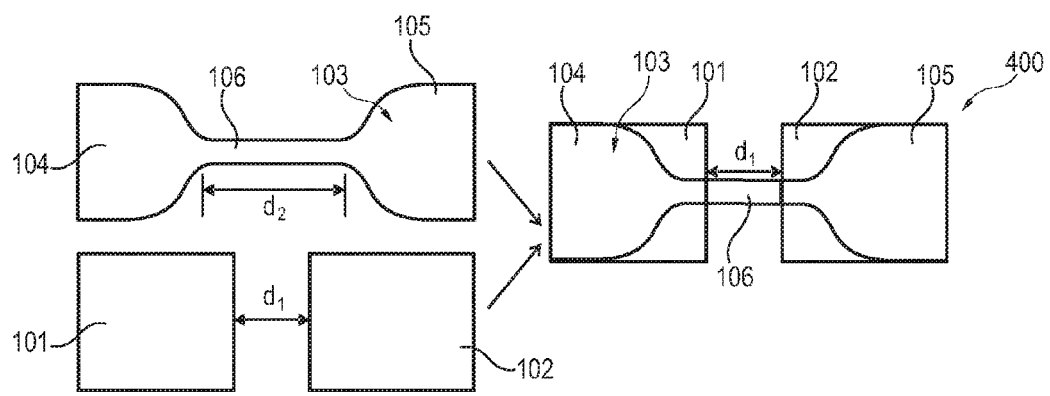

FIG. 4 shows an illustration of a phase change structure 103 having a dogbone shape. Furthermore, the two electrodes 101, 102 provided at distance $d_1$ from one another are shown. The configuration of FIG. 4 is highly symmetric, which can be taken particularly from the view in which the dogbone structure 103 is arranged symmetrically on the electrodes 101, 102. The dogbone structure of FIG. 4 may be advantageous for reducing the contact resistance. The distance $d_1$ needs to be kept small for keeping the length of the amorphous spot short and smaller than $d_1$ (so keeping the threshold voltage low), and for keeping the total resistance of the phase change material line 400 low (including phase change material 103 and electrodes 101, 102).

Figure 5:
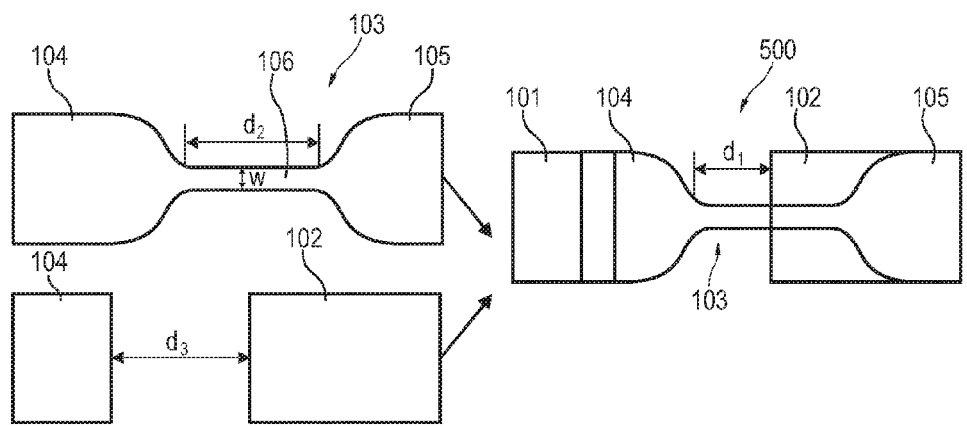

FIG. 5 shows a similar embodiment as FIG. 4, however with the dogbone phase change material 103 and the electrodes 101, 102 being in an asymmetric configuration. Particularly, the broad portion 104 of the dogbone phase change material structure 103 has a larger area than the second broad portion 105. The first electrode 101 has a smaller area than the second electrode 102. In case that for processing reasons, $d_2 \gg d_1$ and $d_3 \gg d_1$, the effective line length $d_1$ can be obtained in this way ($d_2$ and $d_3$ need not be equal). One of such processing reasons may be the following: In order to have a small RESET current, the line needs to be narrower/thinner near the center (that is to say W should be small in FIG. 5). For lithographic reasons (proximity effects) W can be made smaller if $d_2$ is large.

Figure 6:
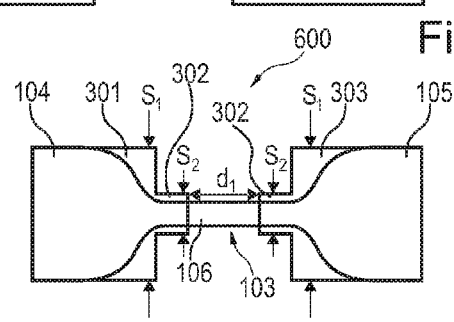

FIG. 6 shows an electronic component 600 according to another exemplary embodiment of the invention, in which the electrodes comprise broad portions 301, 303 (having a thickness $s_1$) and narrow portions 302, 304 (having a thickness $s_2$), similarly as in FIG. 3. The phase change line 103 has a dogbone symmetry.

Figure 7:
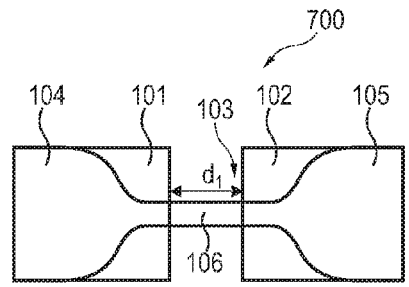

FIG. 7 shows an electronic component 700 having rectangular electrodes 101, 102 and a dogbone phase change material 103.

Figure 8:
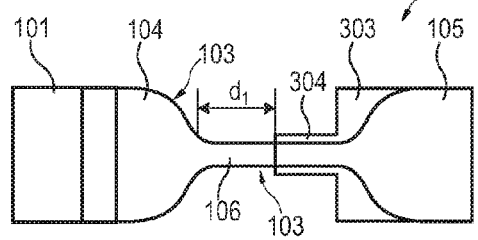

FIG. 8 shows a configuration in which one electrode 101 is rectangular and the second electrode 303, 304 has a broad portion 303 and a narrow portion 304. The phase change material 103 is provided as in a dogbone configuration.

Figure 9:
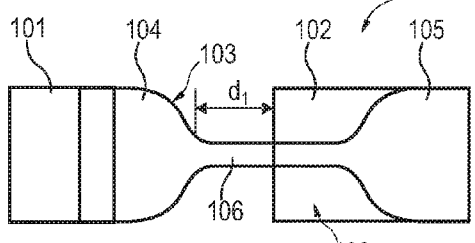

FIG. 9 shows an embodiment of an electronic component 900 with a symmetric dogbone phase change material 103 and with two asymmetric electrodes 101, 102 having rectangular shape of different area.

The structures of FIG. 6 and FIG. 8 may be preferred over the structures of FIG. 7 and FIG. 9, respectively. A reason behind it is that the heat leakage towards the electrodes 101, 102 may be reduced, by the length of the amorphous spot is still kept smaller than $d_1$.

Figure 10:
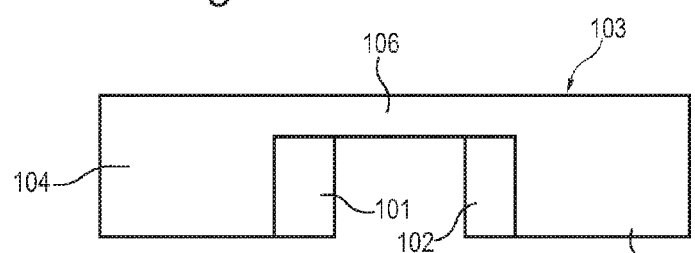
FIG. 10 to FIG. 13 show geometric shapes of phase change materials implementable in electronic components according to exemplary embodiments of the invention.
Figure 11:
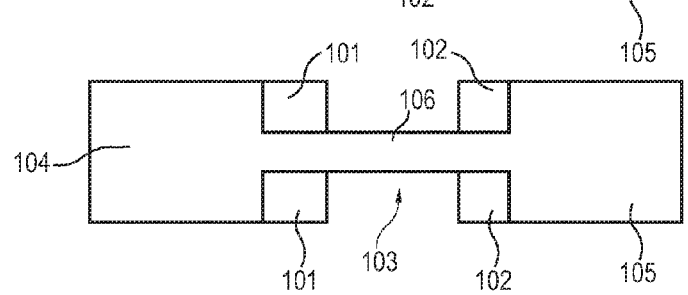
Figure 12:
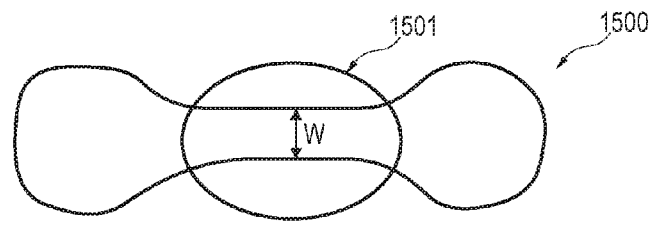
Figure 13:
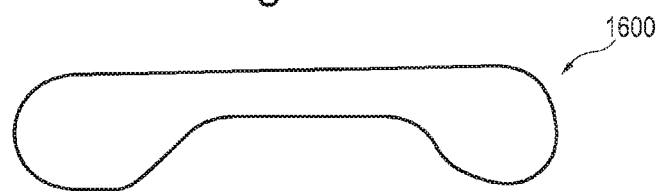

FIG. 10 shows a geometry 1300 for a memory cell which has a U-shaped phase change material structure 103. Electrodes 101, 102 are attached to inner walls of the reverse U. Another geometry 1400 is shown in FIG. 11, here a dogbone structure is shown. With the geometry of FIG. 10, it is possible to fabricate very narrow lines. The reason for that is due to the proximity effects after processing, the geometry of FIG. 11 looks like shown in FIG. 12 illustrating an image 1500. The central portion denoted with reference numeral 1501 then has to be narrow (for instance W is small). The geometry 1300 of FIG. 10 will look similarly as shown in FIG. 13 in a real configuration and will suffer less from proximity effects. This is indicated in an illustration 1600.

Figure 14:
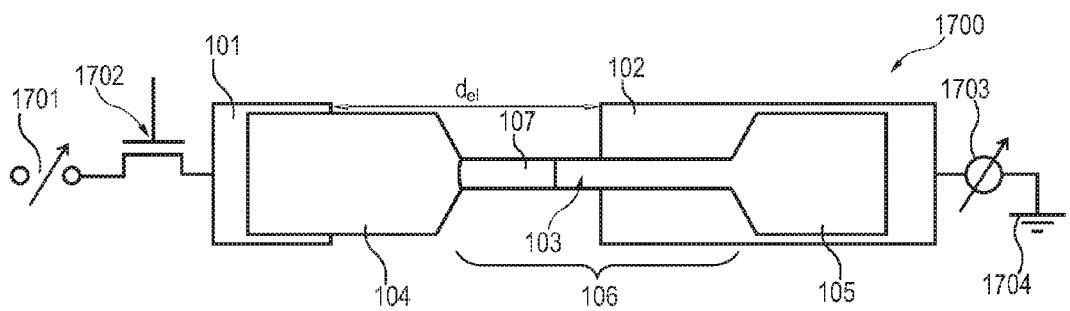
FIG. 14 shows a memory cell according to an exemplary embodiment of the invention.

FIG. 14 shows geometry similar to the electronic component 100, however having further an electronic circuitry, which makes the electronic device 100 being operated as a memory cell 1700.

A voltage source/current source 1701 is provided. When a switch transistor 1702 is operated to be conductive, that is to say if a corresponding voltage is applied to its gate region, the voltage or current provided by the voltage or current source 1701 is supplied to the first electrode 101, flows through the phase change structure 103 and is supplied to the second electrode 102. Depending on the phase state of the convertible structure 103, the current detected by a current or source detector 1703 will be larger or smaller. A reference potential 1704 may be the ground potential. By switching the line portion 106 of the phase change material 103 to an amorphous state (see reference numeral 107) or to a crystalline state, the logical information "1" or "0" may be stored in the memory cell 1700.

Figure 15:
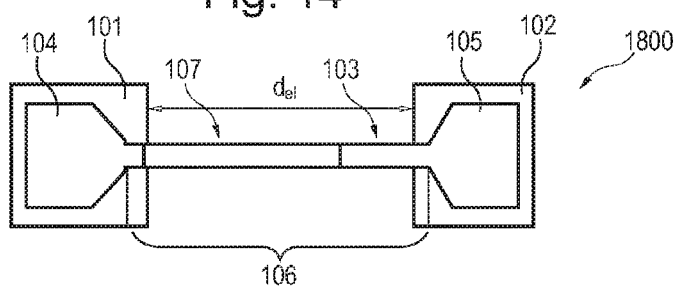
FIG. 15 show an electronic component according to an exemplary embodiment of the invention.

FIG. 15 shows an embodiment 1800 in which only a small portion of the narrow portion 107 overlaps with the respective electrodes 101 or 102.

Figure 16:
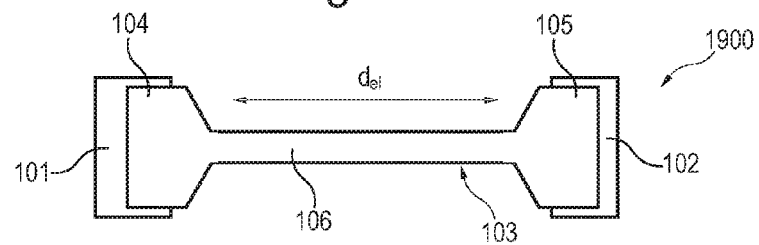
FIG. 16 and FIG. 17 show conventional electronic components.

FIG. 16 shows a conventional structure 1900 in which no overlap occurs, resulting in a large amorphous spot, therefore yielding a high threshold voltage.

Figure 17:
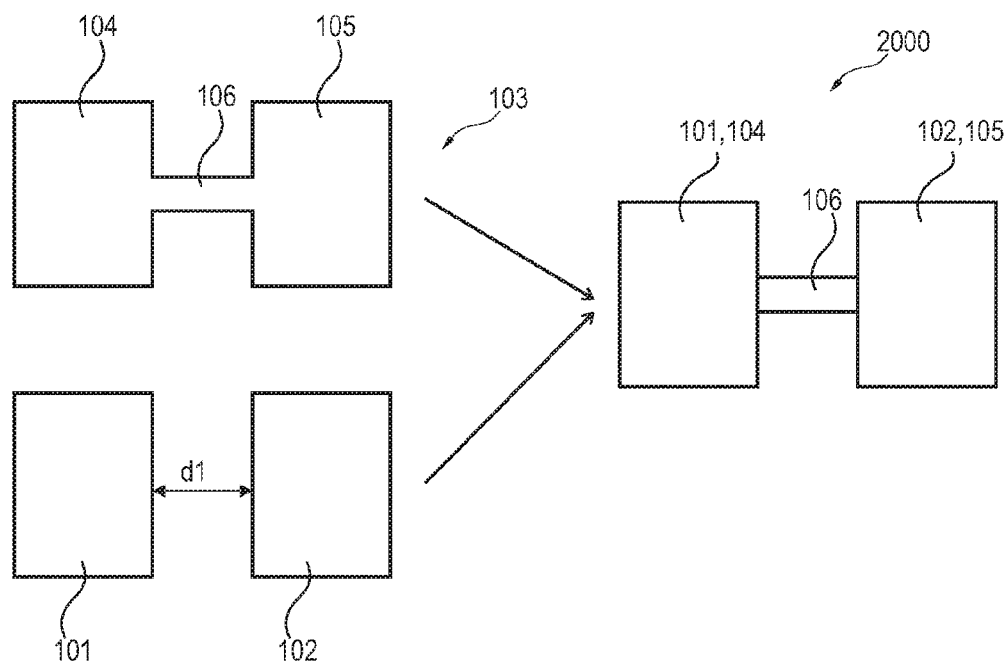

FIG. 17 shows another conventional embodiment 2000 in which a bar-bell shaped phase change line 103 is applied on two rectangular electrodes 101, 102 to form the non-overlapping structure 2000.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. An electronic component comprising:
a first electrode;
a second electrode;
a convertible structure electrically coupled between the first electrode and the second electrode, the convertible structure being convertible between at least two states by heating and having different electrical properties in different ones of the at least two states;
wherein the convertible structure comprises a first terminal portion connected to the first electrode, a second terminal portion connected to the second electrode, and a line portion extending between the terminal portions, the line portion having a smaller thickness than the terminal portions, the line portion exhibiting a uniform thickness along a length thereof;
wherein at least one section of the line portion is arranged to overlap at least one of the group consisting of the first electrode and the second electrode;
wherein the convertible structure is arranged with respect to the first electrode and the second electrode such that:
an entirety of the first terminal portion overlaps the first electrode and at least a portion of the second terminal portion overlaps the second electrode; and
in one of the at least two states, the line portion has an amorphous spot extending along only a part of the line portion from an end of the line portion.

2. The electronic component according to claim 1, wherein the convertible structure is a thermo-dependent structure that is convertible between at least two phase-states.

3. The electronic component according to claim 1, wherein the convertible structure is electrically conductive in at least one in the at least two states.

4. The electronic component according to claim 1, comprising an electronic convertible structure in different ones of the at least two states.

5. The electronic component according to claim 1, wherein the convertible structure is adapted such that a value of the electrical conductivity differs between the at least two states.

6. The electronic component according to claim 1, wherein the convertible structure is adapted such that one of the at least two states relates to a crystalline phase of the convertible structure.

7. The electronic component according to claim 1, further comprising a switch electrically coupled to the convertible structure, wherein the switch is selected from one of the group consisting of a transistor, a field effect transistor, a bipolar transistor, a FinFet, and a diode.

8. The electronic component according to claim 1, wherein the convertible structure is arranged symmetrically with respect to the first electrode and the second electrode.

9. The electronic component according to claim 8, wherein the first electrode and the second electrode are identical regarding at least one of the group consisting of shape, area, and material.

10. The electronic component according to claim 1, wherein the convertible structure is arranged asymmetrically with respect to the first electrode and the second electrode.

11. The electronic component according to claim 10, wherein the first electrode and the second electrode differ regarding at least one of the group consisting of shape, area, and material.

12. The electronic component according to claim 1, wherein the convertible structure is a mirror symmetrical structure.

13. The electronic component according to claim 1, wherein the convertible structure is a non-mirror symmetrical structure.

14. The electronic component according to claim 1, wherein at least one of the group consisting of the first electrode and the second electrode comprises a broad portion and a narrow portion being narrower than the broad portion, wherein the narrow portion overlaps with a section of the line portion.

15. The electronic component according to claim 1, wherein at least one of the group consisting of the first electrode and the second electrode is shaped in a manner of one of the group consisting of a rectangular shape, and an L shape.

16. The electronic component according to claim 1, wherein the convertible structure is shaped in a manner of one of the group consisting of a dogbone shape, a bar-bell shape, and a U shape.

17. The electronic component according to claim 1, adapted as one of the group consisting of a memory device, a memory array, an actuator, a microelectromechanical structure, a controller, and a switch.

18. The electronic component according to claim 1, wherein the first terminal portion has a first tapered portion connected to the line portion and the second terminal portion has a second tapered portion connected to the line portion such that the line portion extends between the first tapered portion and the second tapered portion.

19. The electronic component according to claim 1, wherein the first electrode has main portion and an extension, the extension having a smaller thickness than the main portion, the line portion overlapping the extension.

20. The electronic component according to claim 19, wherein the first terminal portion has a first tapered portion connected to the line portion, and the first tapered portion overlaps the main portion of the first electrode.

21. A method of manufacturing an electronic component, the method comprising:
   electrically coupling a convertible structure between a first electrode and a second electrode, the convertible structure being convertible between at least two states by heating and having different electrical properties in different ones of the at least two states;
   forming the convertible structure to have a first terminal portion connected to the first electrode, a second terminal portion connected to the second electrode, and a line portion extending between the terminal portions, the line portion having a smaller thickness than the terminal portions and having at least one section arranged to overlap at least one of the group consisting of the first electrode and the second electrode, the line portion exhibiting a uniform thickness along a length thereof; and
   arranging the convertible structure with respect to the first electrode and the second electrode such that:
   an entirety of the first terminal portion overlaps the first electrode and at least a portion of the second terminal portion overlaps the second electrode; and
   in one of the at least two states, the line portion has an amorphous spot extending along only a part of the line portion from an end of the line portion.

* * * * *